(12) United States Patent  (10) Patent No.: US 9,276,503 B2
Monfray et al.  (45) Date of Patent: Mar. 1, 2016

(54) ENERGY HARVESTING DEVICE

(71) Applicant: STMicroelectronics (Crolles 2) SAS, Crolles (FR)

(72) Inventors: Stéphane Monfray, Eybens (FR); Thomas Skotnicki, Crolles-Monfort (FR); Christophe Maitre, Barraux (FR); Onoriu Puscasu, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 445 days.

(21) Appl. No.: 13/852,660

(22) Filed: Mar. 28, 2013

(65) Prior Publication Data

US 2013/0257219 A1 Oct. 3, 2013

(30) Foreign Application Priority Data

Apr. 2, 2012 (FR) ...................................... 12 52996

(51) Int. Cl.
| | |
|---|---|
| *H01L 41/04* | (2006.01) |
| *H01L 41/22* | (2013.01) |
| *H02N 99/00* | (2006.01) |
| *H02N 2/18* | (2006.01) |
| *H01L 41/31* | (2013.01) |
| *F03G 7/06* | (2006.01) |

(52) U.S. Cl.
CPC ................. *H02N 2/18* (2013.01); *F03G 7/065* (2013.01); *H01L 41/31* (2013.01); *Y10T 29/42* (2015.01)

(58) Field of Classification Search
CPC .. F03G 7/06; H01H 2061/006; H01H 1/0036; H01H 2001/0042; H01H 61/02; H02N 2/18; H02N 2/183; H02N 2/186; F23Q 3/002; H01L 41/1136

USPC .................................. 310/307, 339; 29/25.35
See application file for complete search history.

(56) References Cited

U.S. PATENT DOCUMENTS

| | | | |
|---|---|---|---|
| 6,640,402 B1 | 11/2003 | Vooren et al. | |
| 7,356,913 B2 | 4/2008 | Fouillet | |
| 7,770,273 B2 | 8/2010 | Abe et al. | |
| 2007/0000864 A1 | 1/2007 | Abe et al. | |
| 2008/0074002 A1* | 3/2008 | Priya et al. | 310/339 |
| 2008/0238260 A1 | 10/2008 | Xu et al. | |
| 2010/0295655 A1 | 11/2010 | Pannek | |

(Continued)

FOREIGN PATENT DOCUMENTS

| | | | | |
|---|---|---|---|---|
| CN | 1611361 A | * | 5/2005 | ................. B41J 2/16 |
| EP | 1384884 A1 | | 1/2004 | |

OTHER PUBLICATIONS

Search Report and Written Opinion dated Nov. 26, 2012 from corresponding French Application No. 12/52996.

(Continued)

*Primary Examiner* — Thomas Dougherty
(74) *Attorney, Agent, or Firm* — Seed IP Law Group PLLC

(57) ABSTRACT

An energy harvester including first and second sheets; and a plurality of walls, each wall being sandwiched between the first and second sheets and surrounding a cavity, wherein each cavity houses at least one curved plate adapted to change from a first shape to a second shape when its temperature reaches a first threshold and to return to the first shape when its temperature falls to a second threshold lower than said first threshold.

24 Claims, 3 Drawing Sheets

(56) References Cited

U.S. PATENT DOCUMENTS

2011/0083714 A1* 4/2011 Descure .................... 136/239
2013/0280549 A1* 10/2013 Monfray et al. ............. 428/603
2015/0022054 A1* 1/2015 Monfray et al. ............. 310/307

OTHER PUBLICATIONS

French Search Report and Written Opinion dated Feb. 28, 2013 from related French Application No. 12/52997.

* cited by examiner

ENERGY HARVESTING DEVICE

CROSS REFERENCE TO RELATED APPLICATIONS

This application claims the priority benefit of French patent application number 12/52996, filed on Apr. 2, 2012, which is hereby incorporated by reference to the maximum extent allowable by law.

BACKGROUND

1. Technical Field

The present disclosure relates to an energy harvesting device and to a method of forming such a device. In particular, the present disclosure relates to a device that converts thermal energy into electrical energy.

2. Discussion of the Related Art

It has been proposed to use a bimetal plate, which changes shape under varying temperature conditions, in combination with a layer of piezoelectric material, to convert thermal energy into electrical energy.

FIG. 1 substantially reproduces FIG. 2 of U.S. patent application 2011/083714. As illustrated, a curved bimetal plate 100 comprises a support layer 102, which changes shape in response to temperature variations. Plate 100 is shown having a first shape in the form of an arch, and for example changes shape to the form of an inverted arch when its temperature changes. A layer 104 of piezoelectric material is superposed over the support layer 102. A piezoelectric material is one that has the property of generating a voltage difference between its main surfaces that varies depending on the stress applied to it. During a shape change of the curved metal plate 100, a stress S occurs in the piezoelectric layer 104, represented by arrows in FIG. 1, resulting in variations in the voltage signals $V_-$ and $V_+$ present on the top and bottom surfaces of the piezoelectric layer 104. The curved metal plate 100 is, for example, positioned in a cavity between hot and cold walls, such that its middle section contacts with the hot and cold walls when the curved plate 100 assumes its respective shapes. This results in a periodic shape change of the metal plate 100, leading to the generation of a periodic voltage signal from which electrical energy can be extracted.

There is a need in the art for a simple and low cost energy harvester that operates based on the above principles and that can provide an efficient conversion of thermal to electrical energy in a range of different environments.

SUMMARY

It is an aim of embodiments to at least partially address one or more needs in the prior art.

According to one aspect, there is provided an energy harvester comprising: first and second sheets; and a plurality of walls, each wall being sandwiched between the first and second sheets and surrounding a cavity, wherein each cavity houses at least one curved plate adapted to change from a first shape to a second shape when its temperature reaches a first threshold and to return to the first shape when its temperature falls to a second threshold lower than said first threshold.

According to one embodiment, each of said cavities houses a single curved plate.

According to another embodiment, each of said cavities houses a plurality of curved plates interconnected by fingers to form a matrix.

According to another embodiment, between said first and second sheets, there is a space separating a first of said walls from a second of said walls.

According to another embodiment, the energy harvester further comprises, within each of said cavities, a printed layer of piezoelectric material adapted to be deformed by said curved plate.

According to another embodiment, said piezoelectric layer is printed onto an inner surface of each cavity on a surface of said first sheet.

According to another embodiment, said piezoelectric layer is printed on a surface of each curved plate.

According to another embodiment, said inner walls are arranged in at least one column and in at least one row.

According to another embodiment, each of said curved plates comprises a layer of a first metal superposed by a layer of a second metal, the first and second metals having different coefficients of expansion.

According to another embodiment, each of said curved plates is formed of a shape-memory material.

According to a further aspect, there is provided a method of manufacturing an energy harvester comprising: forming a plurality of walls on a first sheet of material, each wall defining an opening which it surrounds; placing at least one curved plate into each of said openings, each curved plate being adapted to change from a first shape to a second shape when its temperature reaches a first threshold and to return to the first shape when its temperature falls to a second threshold lower than said first threshold; and sandwiching each of said walls between said first sheet and a second sheet of material.

According to one embodiment, the method comprises placing a matrix of curved plates into each of said openings.

According to another embodiment, the method further comprises printing a layer of piezoelectric material on either: each of said curved plates; or each of a plurality of zones on the surface of said first sheet, each opening being aligned over one of said zones.

According to another embodiment, the method further comprises printing, on said first sheet, interconnecting tracks comprising a plurality of electrodes adapted to make contact with each of said piezoelectric layers.

According to another embodiment, the material forming each of said first and second sheets is a plastic or insulated metal having a thickness of between 0.5 mm and 5 mm.

BRIEF DESCRIPTION OF THE DRAWINGS

The foregoing and other purposes, features, aspects and advantages will become apparent from the following detailed description of embodiments, given by way of illustration and not limitation with reference to the accompanying drawings, in which.

Figure 1:
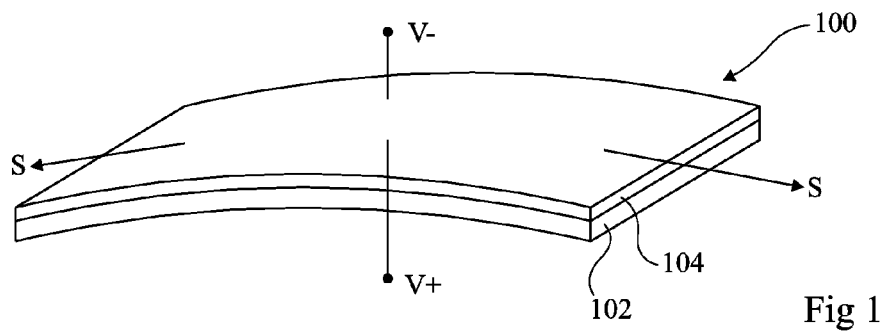
FIG. 1 (described above) illustrates a curved metal plate in order to demonstrate a technique for thermal energy harvesting.

It should be noted that the structures illustrated in the various figures are not drawn to scale, the thicknesses of certain layers in particular being shown to be disproportionately large to aid representation.

Furthermore, throughout the following description, relative orientations such as "top surface", "bottom surface", "upper" and "lower" are assumed to apply when the corresponding structure is orientated as shown in the drawings.

DETAILED DESCRIPTION

Figure 2:
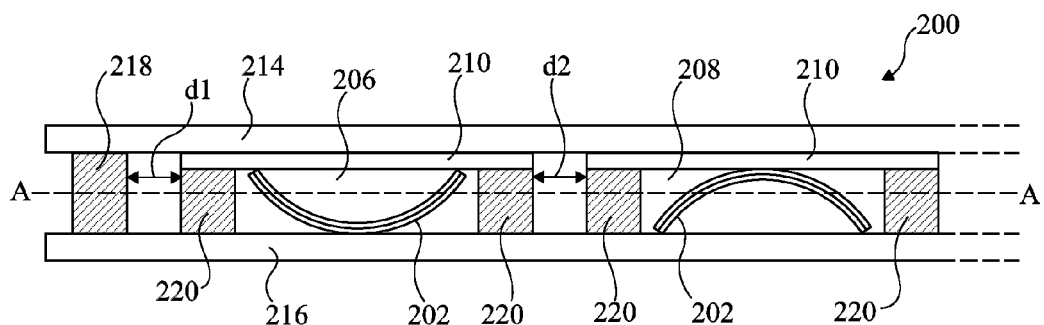
FIG. 2 is a cross-section view illustrating part of a thermal energy harvester according to an example embodiment.

FIG. 2 is a cross-section view illustrating a portion of an energy harvester 200 according to an example embodiment. Two curved plates labelled 202 are positioned in corresponding cavities 206, 208 of the energy harvester 200. For example, each of these plates 202 corresponds to the curved bimetal plate 100 of FIG. 1 described above, except that it does not comprise the layer 104 of piezoelectric material superposed over the support layer 102. Instead, a top wall of each cavity 206, 208 is formed by a corresponding layer of piezoelectric material 210.

The curved plates 202 are, for example, bimetal plates, formed of a layer of a first metal superposed by a layer of a second metal, the first and second metals having different coefficients of expansion. For example, the metal of each layer is one of TiN, aluminium, copper, tungsten, FeNi and an alloy of any of these metals. Alternatively, one or both layers could be formed of non-metals.

For example, the width and length of the curved plates are in the range of 1 µm to 10 mm. A method of forming curved plates having relatively small dimensions is for example discussed in more detail in U.S. Pat. No. 8,951,425, filed on the same day as the present patent application and having the same inventors, which is hereby incorporated by reference in its entirety.

In some embodiments, the curved plates 202 are formed such that their change of shape in response to temperature variations is progressive, for example between the two shapes of the plates 202 illustrated in cavities 206 and 208 of FIG. 2.

In alternative embodiments, the curved plates 202 are bi-stable, such that they flip rapidly from one shape to another when heated to a first temperature threshold, and back to their original shape when cooled to a second temperature threshold, lower than the first temperature threshold. For example, the curved plates 202 may comprise, as one of its layers, a shape-memory material, for example a nickel and titanium alloy. Such a material for example comprises two crystal phases, and is capable of having two stable shapes. Alternatively, the curved plate 202 may have an inward force applied to its ends by one or more springs, resulting in such a bi-stable effect.

The structure of the energy harvester 200 for example comprises an upper sheet of material 214 and a lower sheet of material 216. For example, the upper and lower sheets 214, 216 are each formed of a plastic sheet or of an insulated metal sheet. The sheets 214, 216 are for example flexible and each have a thickness of between 0.5 mm and 5 mm, depending on the size of the energy harvester 200 and the desired extent of flexibility.

On the left-hand side of the structure shown in FIG. 2, a peripheral wall 218, for example formed of gum, silicon, silicon dioxide, or porous-silicon, separates the sheets 214 and 216. The peripheral wall 218 for example extends around the whole device close to the edges of the sheets 214 and 216, as will be described in more detail below. For example, the separation between the inner surfaces of the upper and lower sheets 214, 216 is in the range of 0.5 mm to 20 mm.

The piezoelectric layers 210 of each cavity 206, 208 are positioned at regular intervals on the inner surface of the upper sheet 214. An inner wall 220, also for example formed of gum, silicon, silicon dioxide, or porous-silicon for example surrounds each cavity 206, 208, and contacts the respective piezoelectric layers 210 above, and contacts the top surface of the lower sheet 216 below.

The peripheral wall 218, and the inner wall 220 corresponding to the left-hand cavity 206 in FIG. 2, are separated by a distance d1, for example of between 1 and 20 mm. The inner walls 220 corresponding to neighbouring cavities 206, 208 in FIG. 2 are separated by a distance d2 also of, for example, between 1 and 20 mm.

As represented by dashed lines extending from the right-hand edge of the structure of FIG. 2, the structure may continue beyond what is illustrated in FIG. 2, with one or more further cavities containing further curved plates 202.

Figure 3:
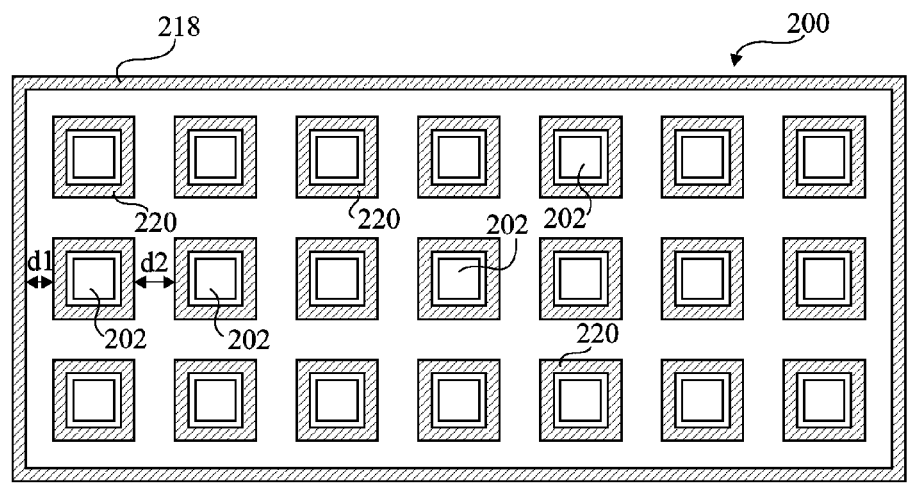
FIG. 3 is a cross-section, taken in a horizontal plane, of the energy harvester of FIG. 2 according to an example embodiment.

FIG. 3 illustrates an example of a cross-section view of the energy harvester 200, in a horizontal plane represented by a dashed line A-A in FIG. 2, passing through the peripheral wall 218 and inner walls 220.

In the example of FIG. 3, the energy harvester 200 comprises 21 curved plates 202, each housed in a corresponding cavity, and arranged in 3 rows and 7 columns. Of course, in alternative embodiments, the energy harvester could comprise any number of curved plates. In some embodiments, hundreds, thousands or even millions of curved plates may be provided, each housed in a corresponding cavity or grouped into cavities. In particular, in some embodiments, each cavity houses a single curved plate. In alternative embodiments described in more detail with reference to FIG. 6, each cavity houses a plurality of curved plates formed in a matrix.

An advantage of housing the curved plates in cavities, each cavity being surrounded by an inner wall 220, is that the structure may be relatively flexible. Furthermore, an advantage of arranging the inner walls 220 in rows and columns is that this adds to the flexibility of the structure. In alternative embodiments, rather than being arranged in rows and columns, the inner walls 220 could be arranged in different patterns.

In plan view, the energy harvester 200 is for example rectangular in shape, and the peripheral wall 218 thus extends in a rectangle around the edge of the device. Furthermore, each of the inner walls 220 also for example extends around the corresponding cavity in the form of a rectangle, the rectangle being square in the example of FIG. 3.

Such a rectangular shape of the inner walls 220 is well adapted to rectangular plates 202. In alternative embodiments, the curved plates 202 and inner walls 220 could have other shapes, for example circular or hexagonal.

A method of forming an energy harvester similar to that of FIGS. 2 and 3 will now be described with reference to FIGS. 4A to 4E.

FIGS. 4A to 4E are perspective views of an energy harvester 400 at various stages of manufacture, in this example comprising 35 plates 202 arranged in seven columns and five rows.

Figure 4:
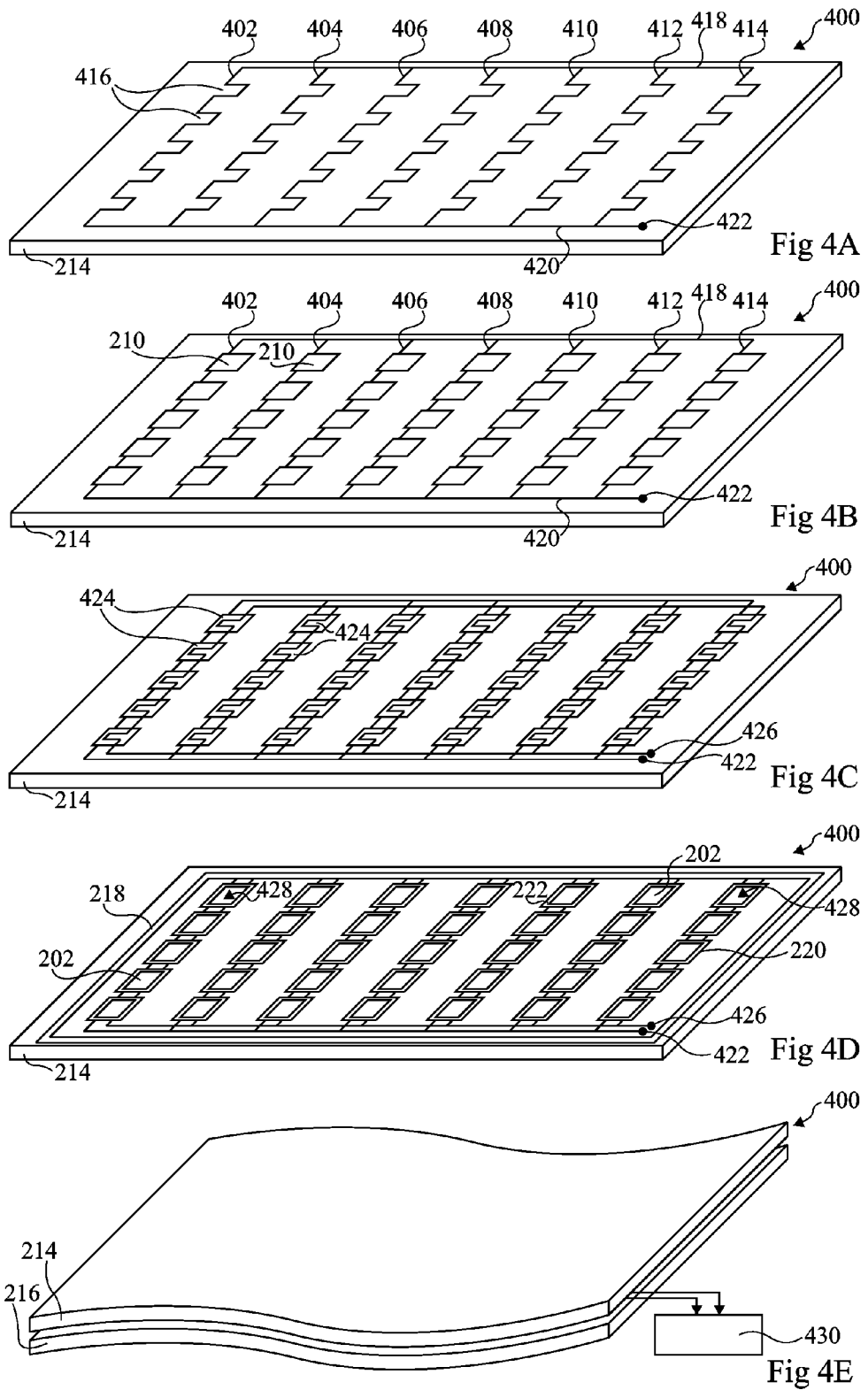
FIGS. 4A to 4E are perspective views of an energy harvester at various stages during its manufacture according to an example embodiment.

With reference to FIG. 4A, in a first step, a grid of conductive tracks is printed or otherwise deposited on the surface of the upper sheet 214 of the structure of FIG. 2. The top surface of the sheet 214 shown in FIG. 4A corresponds to the bottom surface of the sheet 214 orientation as shown in FIG. 2.

In the example of FIG. 4A, the grid of conducting tracks comprises seven tracks 402 to 414 formed in columns. Each of the tracks 402 to 414 comprises five regularly spaced electrodes 416, in this example formed as "U" shaped tracks. Thus there are a total of 35 electrodes. The respective ends of the tracks 402 to 414 are coupled together by respective tracks 418 and 420 running perpendicular to the column tracks 402 to 414. The track 420 is for example coupled to a connection terminal 422 close to an edge of the sheet 214.

For example, the conductive tracks could be formed of copper or another suitable conducting material, and printed using PCB (printed circuit board) techniques, which are well known in the art.

FIG. 4B illustrates the upper sheet 214 after a subsequent step in which a piezoelectric layer 210 has been formed over each electrode 416. For example, the piezoelectric material is formed of PZT (lead zirconate titanate), ZnO or a compound based on lead and zirconium. The piezoelectric layers 210 could be coated, deposited or printed. For example techniques for printing such a material are discussed in more detail in the publication entitled "Processing of Functional Fine Scale Ceramic Structures by Ink-Jet Printing", M. Mougenot et al., the contents of which is hereby incorporated by reference to the extent permitted by the law.

In some cases, the printing or depositing of the piezoelectric layers 210 may be followed by a baking step, for example at a temperature of 200° C. or less.

FIG. 4C illustrates the structure after a subsequent step in which a further grid of conducting tracks is formed over the surface of upper sheet 214, this further grid being very similar to the grid discussed above with reference to FIG. 4A. In particular, the further grid of conducting tracks comprises electrodes 424, one of which is formed over each piezoelectric layer 210. To prevent electrical contact between the conductive tracks of each of the superposed grids, an insulating layer is for example deposited in some areas prior to forming the further grid. The further grid of conducting tracks is coupled to a further terminal 426 near an edge of the upper sheet 214.

The further grid of conducting tracks comprising the electrodes 424 is for example printed or coated, for example using well known techniques, such as those used to print RFID (Radio Frequency Identification) antennas.

FIG. 4D illustrates yet a further step in which the peripheral wall 218 and inner walls 220 are formed over the surface of the upper sheet 214, and a curved plate 202 is positioned within each inner wall 220. In particular, the step of placing each of the inner walls on the surface of the upper sheet 214 for example defines a corresponding opening 428 surrounded by the inner wall, and into which the plates 202 are placed.

In some embodiments, the curved plates 202 are individual elements. Alternatively, they could form a matrix, being interconnected by one or more fingers. Such fingers could be embedded in the inner walls 220.

FIG. 4E illustrates a final step of the method in which the lower sheet 216 is glued to the structure opposite the upper sheet 214 to form the finished energy harvester 400. In some embodiments, this final gluing step may be performed in a partial vacuum such that the cavities defined by each inner wall 220 are at a partial vacuum, and likewise the spacing between the inner walls 220 in the area between the sheets 214, 216 is also for example at a partial vacuum. Such a feature improves the insulation between the upper and lower sheets 214, 216.

The terminals 422 and 426 (not illustrated in FIG. 4E) are for example coupled to energy recuperation circuitry 430, which recuperates the electrical energy resulting from the voltage changes across the surfaces of the piezoelectric layers 210. This electrical energy is for example used to charge a battery and/or supply a load (not illustrated in the figures).

As represented in FIG. 4E, due in part to the form of the inner walls 220, the resulting energy harvester 200 is for example relatively flexible, for example being able to be bent around pipes or placed in contact with other uneven surfaces. Such flexibility improves the thermal contact between the energy harvester 400 and a heat source, and thus leads to a higher thermal gradient across the energy harvester. This in turn leads to greater energy recuperation. Indeed, the warmer the lower sheet 216, the faster the curved plates 202 will be heated and change shape, thereby increasing the mechanical power generated by the curved plates and thus the electrical power generated by the piezoelectric layers 210.

The surface area of the device 200 could be anything from a few square millimeters to several square meters. For example, in some embodiments the device 200 has a surface area of at least 0.1 square meters.

In an alternative embodiment, the upper sheet 214 and/or lower sheet 216 could comprise features contributing to the final structure. For example, the inner walls 220 and/or peripheral wall 218 could at least partially be formed of a protrusion from the surface of the lower sheet 216.

Figure 5:
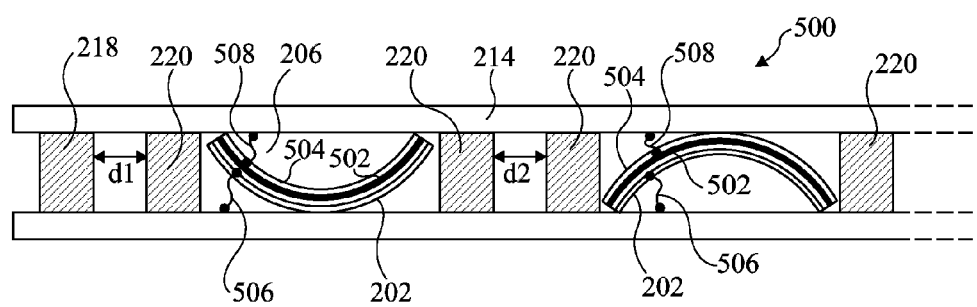
FIG. 5 is a cross-section view illustrating part of a thermal energy harvester according to an alternative embodiment.

FIG. 5 is a cross-section view illustrating a portion of an energy harvester 500 according to an alternative embodiment. The energy harvester 500 is very similar to the energy harvester 200 of FIG. 2, and like features have been labeled with like reference numerals and will not be described again in detail.

In energy harvester 500, the piezoelectric layers 210 are removed, the inner walls 220 extending to the underside of the upper sheet 214. Instead, each of the curved metal plates 202 comprises a piezoelectric layer 502, which is for example similar to the layer 104 of FIG. 1. Furthermore, an electrode 504 is for example deposited or coated over the piezoelectric layer. In one example, the electrical signals generated by such a piezoelectric layer 502 are recuperated by electrodes (not illustrated in FIG. 5), similar to electrodes 416, 424 described above, printed on the inner surfaces of the upper and lower sheets 214, 216. As illustrated, a connecting wire 506 for example couples the electrode 504 to such an electrode formed on the underside of the upper sheet 214, and a connecting wire 508 for example couples the metal layers of curved plate 202 to an electrode formed on the top side of the lower sheet 216.

Figure 6:
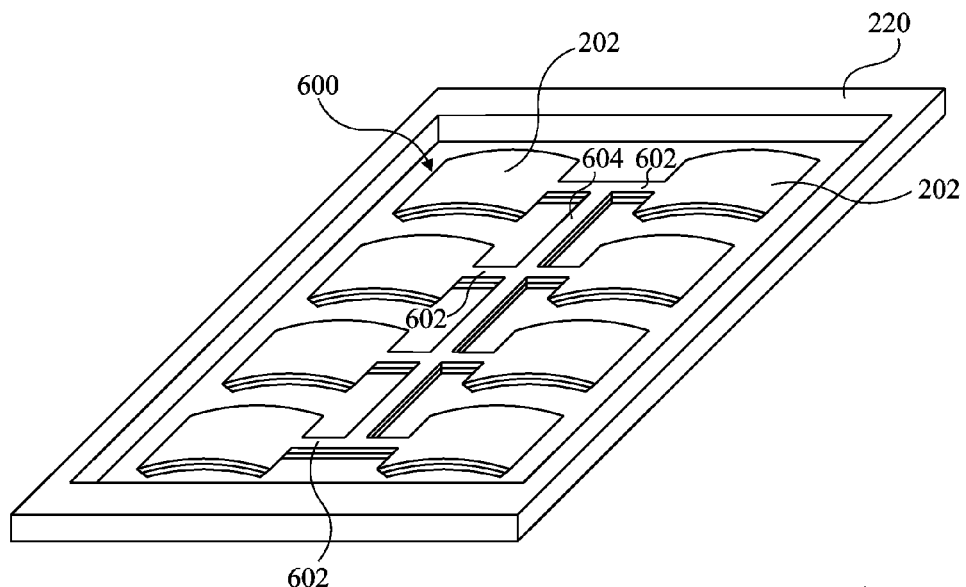
FIG. 6 is a perspective view illustrating a matrix of curved plates according to an example embodiment.

FIG. 6 is a perspective view illustrating a portion of the structure of FIG. 3 in more detail according to an example in which each of the cavities defined by the inner walls 220 houses a matrix 600 of curved plates 202. In the example of FIG. 6, the matrix 600 comprises eight plates arranged in two columns and four rows, although in alternative embodiments the matrix could comprise any number of curved plates, such as hundreds or thousands of plates arranged in an appropriate number of columns and rows.

As illustrated in FIG. 6, each of the curved plates 202 is for example attached by a single finger 602 to a common interconnecting rail 604. In this way, despite being interconnected, each of the plates 202 may flip from one bi-stable state to another independently of the other plates.

The interconnecting fingers 602 and rail 604 are, for example, all formed of the same layered structure as the curved plates 202. The matrix 600 is, for example, formed by the method described in relation to FIGS. 5 and 6 of U.S. Pat. No. 8,951,425.

While a number of specific embodiments of a method and device have been described herein, it will be apparent to those skilled in the art that there are various modifications and alterations that could be provided.

For example, it will be apparent to those skilled in the art that while a few examples of arrangements of curved plates within an energy harvester have been described, other arrangements of the plates would be possible.

Furthermore, while rectangular curved plates have been described, in alternative embodiments, the plates could have other forms, such as circular or hexagonal.

Furthermore, the "U" shaped form of the electrodes 416, 424 is merely one example, many other forms being possible.

The various features described in relation with the embodiments described herein could be combined, in alternative embodiments, in any combination.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An energy harvester, comprising:
   first and second sheets of material; and
   a plurality of walls, each wall being sandwiched between the first and second sheets and surrounding a cavity, wherein each cavity houses at least one curved plate adapted to change from a first shape to a second shape when its temperature reaches a first threshold and to return to the first shape when its temperature falls to a second threshold lower than the first threshold, wherein there is a space separating a first wall of the plurality of walls from a second wall of the plurality of walls.

2. The energy harvester of claim 1, wherein each of said cavities houses a single curved plate.

3. The energy harvester of claim 1, wherein each of said cavities houses a plurality of curved plates interconnected by fingers to form a matrix.

4. The energy harvester of claim 1, further comprising, within each of said cavities, a printed layer of piezoelectric material adapted to be deformed by said curved plate.

5. The energy harvester of claim 4, wherein said piezoelectric layer is printed onto an inner surface of each cavity on a surface of said first sheet.

6. The energy harvester of claim 4, wherein said piezoelectric layer is printed on a surface of each curved plate.

7. The energy harvester of claim 1, wherein the plurality of walls are arranged in at least one column and in at least one row.

8. The energy harvester of claim 1, wherein each of said curved plates comprises a layer of a first metal superposed by a layer of a second metal, the first and second metals having different coefficients of expansion.

9. The energy harvester of claim 1, wherein each of said curved plates is formed of a shape-memory material.

10. A method of manufacturing an energy harvester comprising:
    forming a plurality of openings by forming a plurality of walls on a first sheet of material, each of the plurality of openings being surrounded by a respective wall of the plurality of walls;
    placing at least one curved plate into each of the plurality of openings, each curved plate being adapted to change from a first shape to a second shape when its temperature reaches a first threshold and to return to the first shape when its temperature falls to a second threshold lower than the first threshold; and
    sandwiching the plurality of walls between the first sheet and a second sheet of material.

11. The method of claim 10, comprising placing a matrix of curved plates into each of the plurality of openings.

12. The method of claim 10, further comprising printing a layer of piezoelectric material on either:
    each of said curved plates; or
    each of a plurality of zones on the surface of said first sheet, each of the plurality of openings being aligned over one of the plurality of zones.

13. The method of claim 12, further comprising printing, on said first sheet, interconnecting tracks comprising a plurality of electrodes adapted to make contact with each of said piezoelectric layers.

14. The method of claim 10, wherein the material forming each of said first and second sheets is a plastic or insulated metal having a thickness of between 0.5 mm and 5 mm.

15. An energy harvester, comprising:
    first and second sheets of material; and
    a plurality of walls, each wall being sandwiched between the first and second sheets and surrounding a cavity, wherein each cavity houses at least one curved plate adapted to change from a first shape to a second shape when its temperature reaches a first threshold and to return to the first shape when its temperature falls to a second threshold lower than said first threshold, wherein a piezoelectric layer is printed onto an inner surface of each cavity on a surface of said first sheet, and wherein the piezoelectric layer is adapted to be deformed by said curved plate.

16. The energy harvester of claim 15, wherein each of said cavities houses a single curved plate.

17. The energy harvester of claim 15, wherein each of said cavities houses a plurality of curved plates interconnected by fingers to form a matrix.

18. The energy harvester of claim 15, wherein, between said first and second sheets, there is a space separating a first of said walls from a second of said walls.

19. An energy harvester, comprising:
    a first sheet of material;
    a second sheet of material; and
    at least one energy harvester component, the energy harvester component including:
        a wall formed between the first and second sheets;
        a piezoelectric layer formed between the first and second sheets;
        a cavity enclosed by the wall, the first sheet, and the piezoelectric layer; and
        a plate positioned in the cavity, the plate being configured to change to a first shape in response to a first temperature and to a second shape in response to a second temperature, at least a portion of the plate being spaced from the piezoelectric layer when the plate is in the first shape, at least a portion of the plate abutting the piezoelectric layer when the plate is in the second shape.

20. The energy harvester of claim 19, wherein the plate is entirely within the cavity.

21. The energy harvester of claim 19, wherein the piezoelectric layer is formed between the wall and the second sheet.

22. The energy harvester of claim 19, further comprising a plurality of interconnected plates positioned in the cavity.

23. The energy harvester of claim 19, further comprising a surrounding wall separating the first sheet from the second sheets, the surrounding wall surrounding the at least one component.

24. The energy harvester of claim 19, wherein the surrounding wall is spaced from the at least one component.

* * * * *